US009965388B2

(12) United States Patent
Chun et al.

(10) Patent No.: US 9,965,388 B2
(45) Date of Patent: May 8, 2018

(54) MEMORY DEVICE INCLUDING PAGE BUFFER AND METHOD OF ARRANGING PAGE BUFFER HAVING CACHE LATCHES

(71) Applicant: SK hynix Inc., Gyeonggi-do (KR)

(72) Inventors: Ki Chang Chun, Gyeonggi-do (KR); Hee Joung Park, Seoul (KR); Tae Seung Shin, Chungcheongbuk-do (KR); Sung Lae Oh, Chungcheongbuk-do (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days. days.

(21) Appl. No.: 15/398,181

(22) Filed: Jan. 4, 2017

(65) Prior Publication Data

US 2017/0337130 A1 Nov. 23, 2017

(30) Foreign Application Priority Data

May 20, 2016 (KR) .................. 10-2016-0062004

(51) Int. Cl.
*G11C 7/10* (2006.01)
*G06F 12/0802* (2016.01)
*G11C 16/26* (2006.01)
*G11C 16/10* (2006.01)
*G11C 16/08* (2006.01)
*G11C 16/16* (2006.01)

(52) U.S. Cl.
CPC .......... *G06F 12/0802* (2013.01); *G11C 16/08* (2013.01); *G11C 16/10* (2013.01); *G11C 16/16* (2013.01); *G11C 16/26* (2013.01); *G06F 2212/60* (2013.01); *G06F 2212/7203* (2013.01)

(58) Field of Classification Search
None
See application file for complete search history.

(56) References Cited

U.S. PATENT DOCUMENTS

| 7,236,420 B2* | 6/2007 | Chun | G11C 5/025 365/230.03 |
| 2006/0181928 A1* | 8/2006 | Lee | G11C 16/0483 365/185.22 |
| 2012/0008397 A1* | 1/2012 | Shin | G11C 11/5628 365/185.11 |
| 2015/0055421 A1* | 2/2015 | Lim | G11C 7/1039 365/189.05 |

FOREIGN PATENT DOCUMENTS

KR 101100958 12/2011

* cited by examiner

*Primary Examiner* — Harry W Byrne
*Assistant Examiner* — Sultana Begum
(74) *Attorney, Agent, or Firm* — IP & T Group LLP

(57) ABSTRACT

A memory device includes a memory cell array, a plurality of bit lines, and a plurality of page buffers including a plurality of cache latches, exchanging data with the memory cell array through the plurality of bit lines, wherein the plurality of cache latches are arranged in a column direction in parallel with the plurality of bit lines and a row direction perpendicular to the plurality of bit lines, and have a two-dimensional arrangement of M stages in the column direction, where M is a positive integer not corresponding to $2^L$ and L is zero or a natural number.

16 Claims, 12 Drawing Sheets

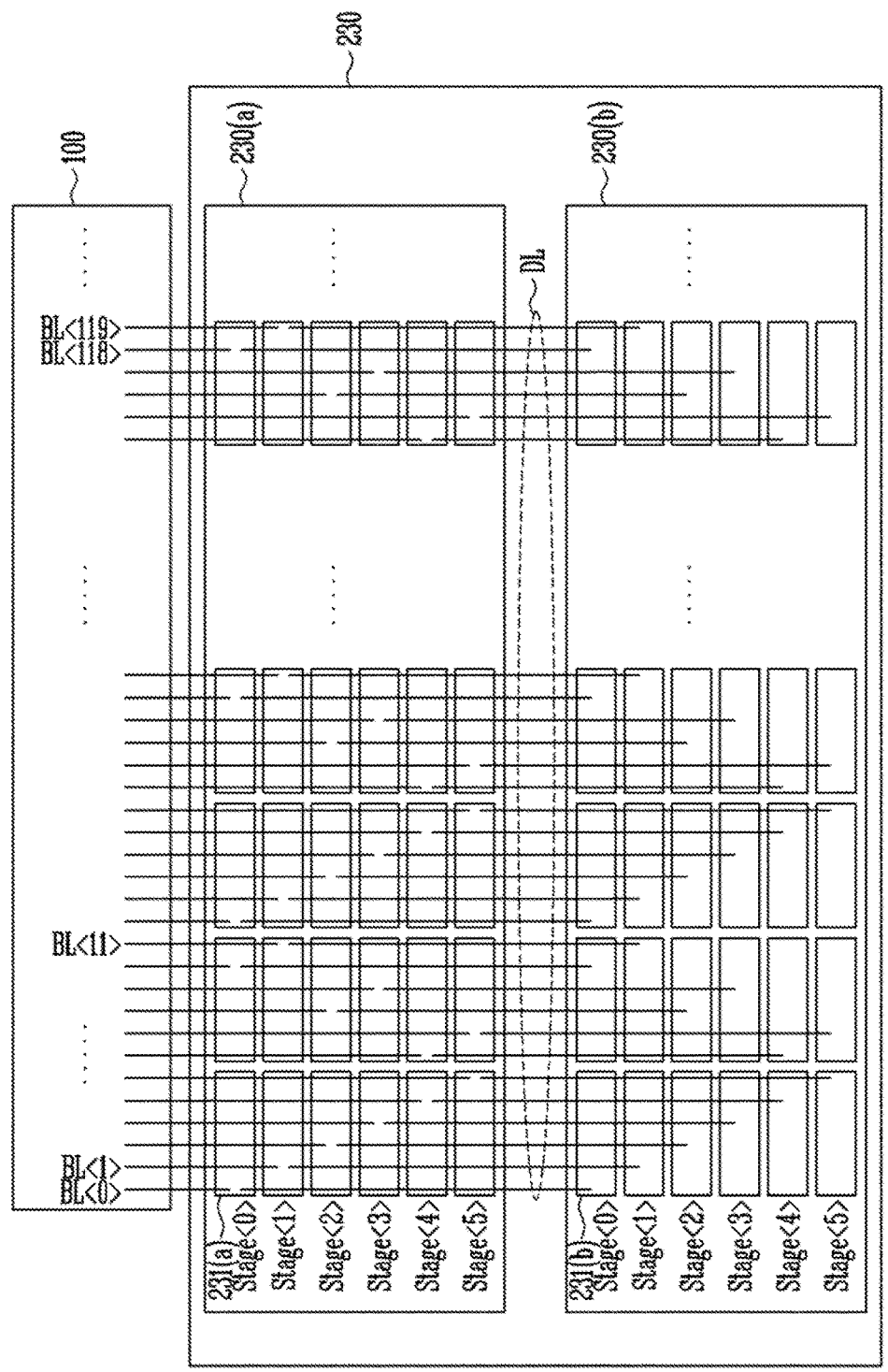

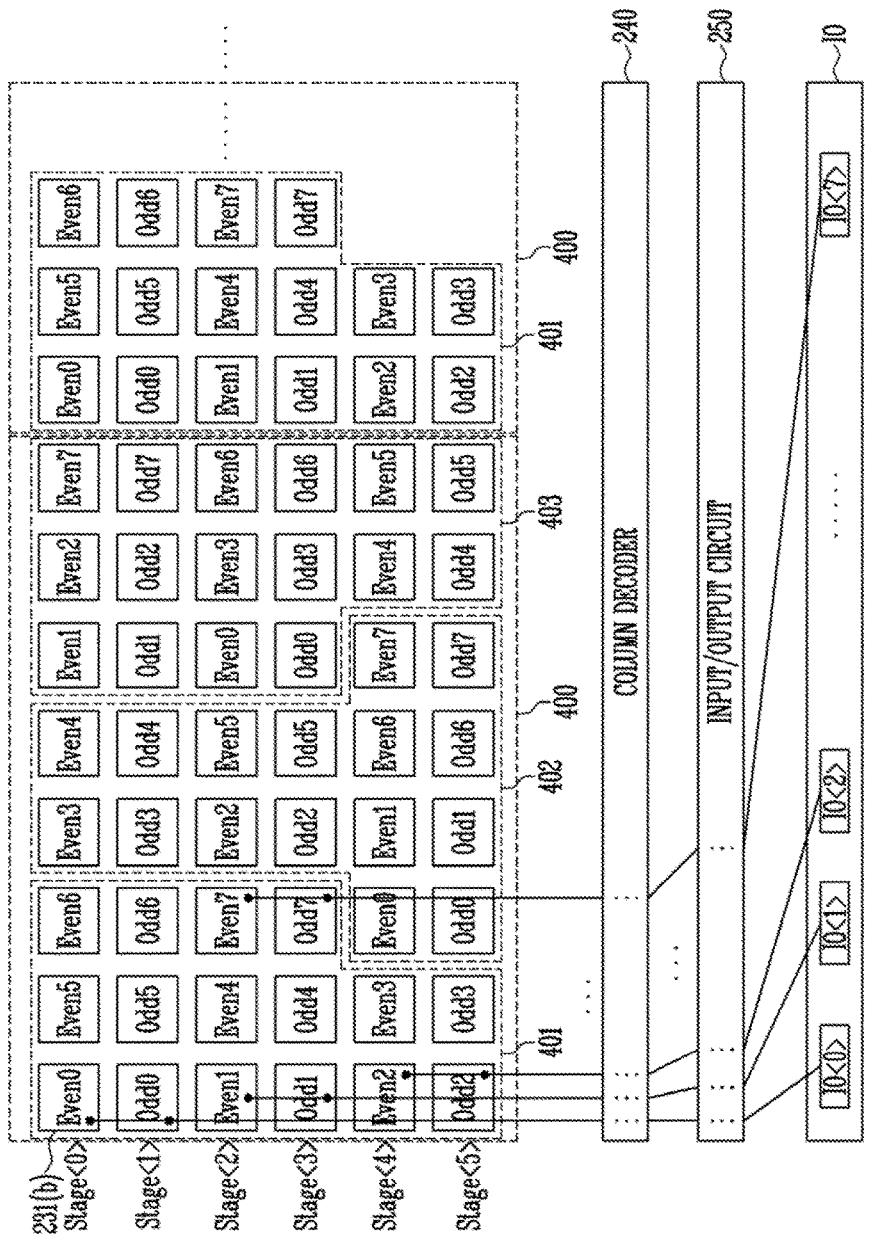

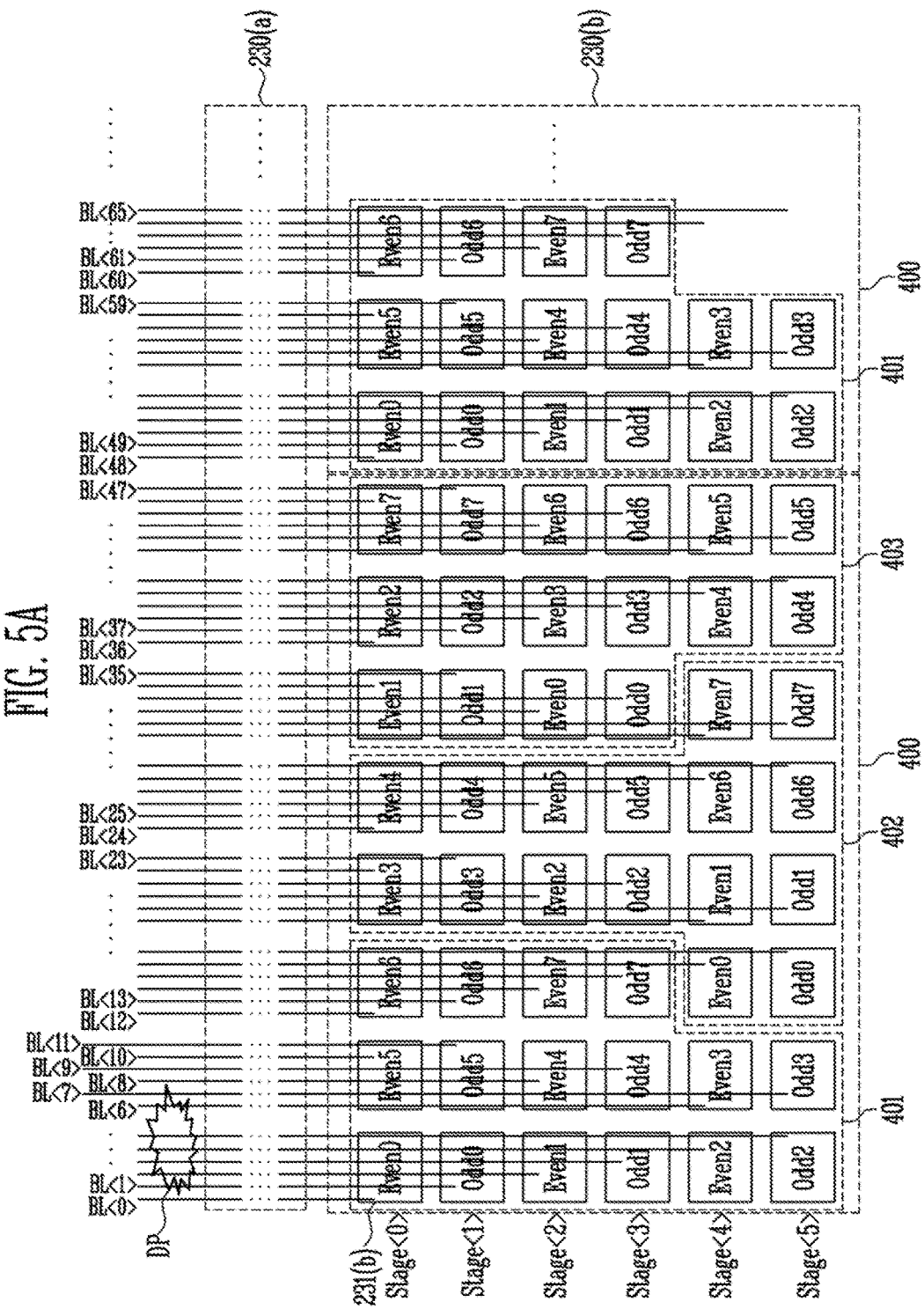

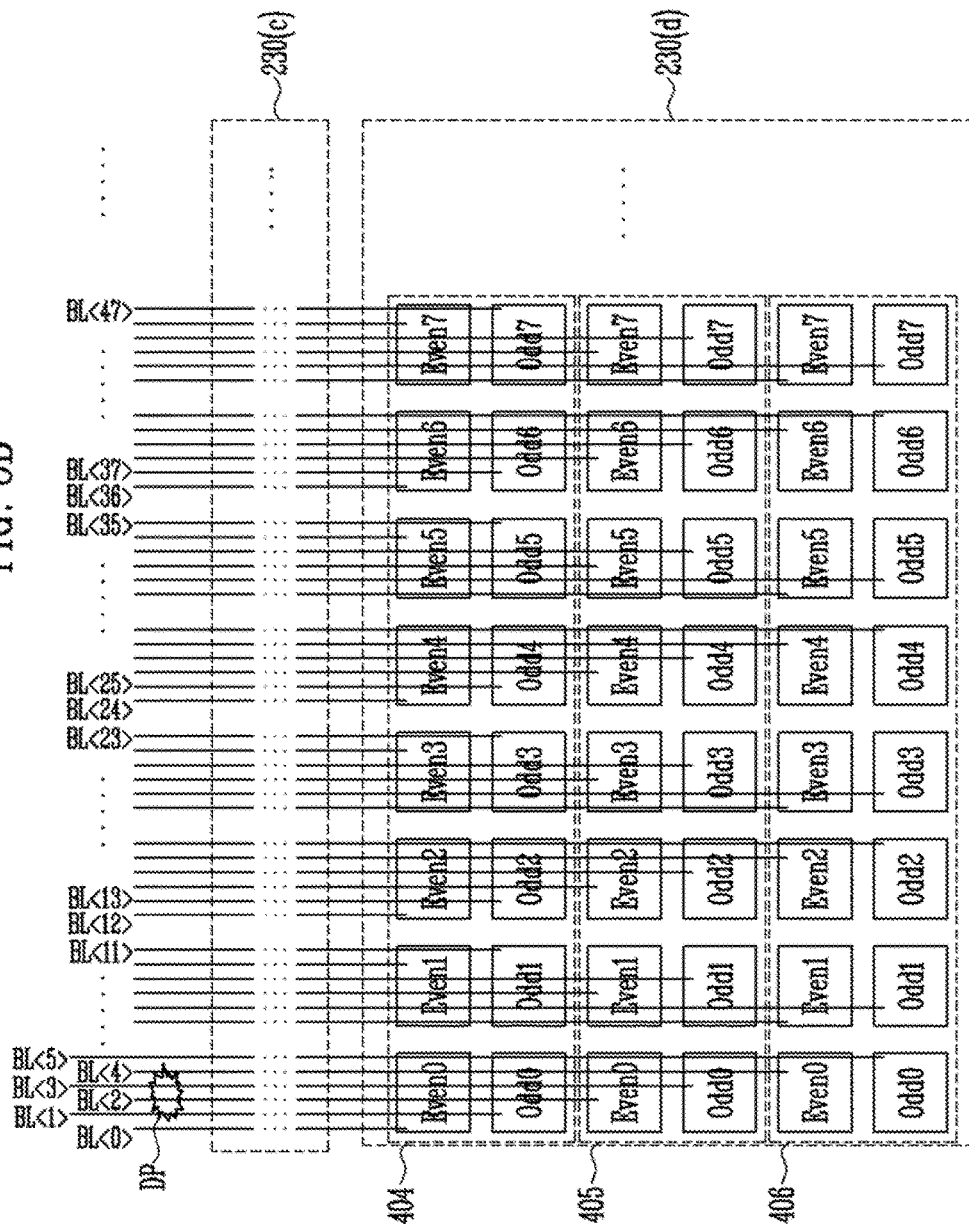

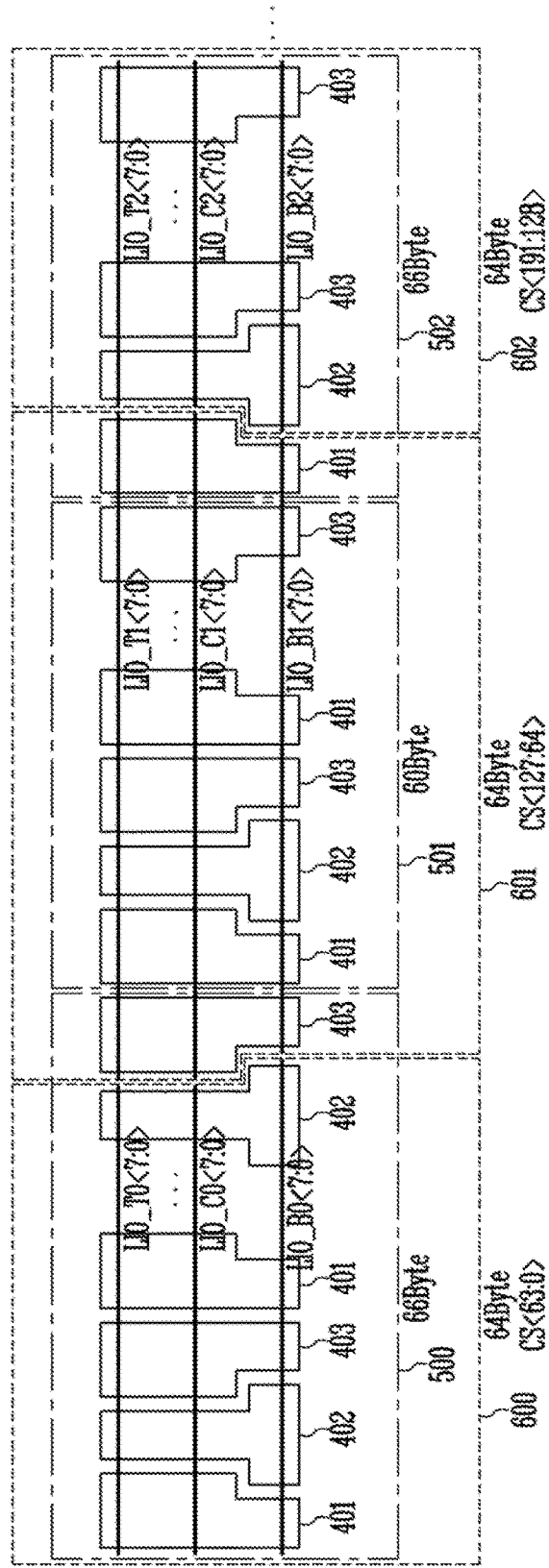

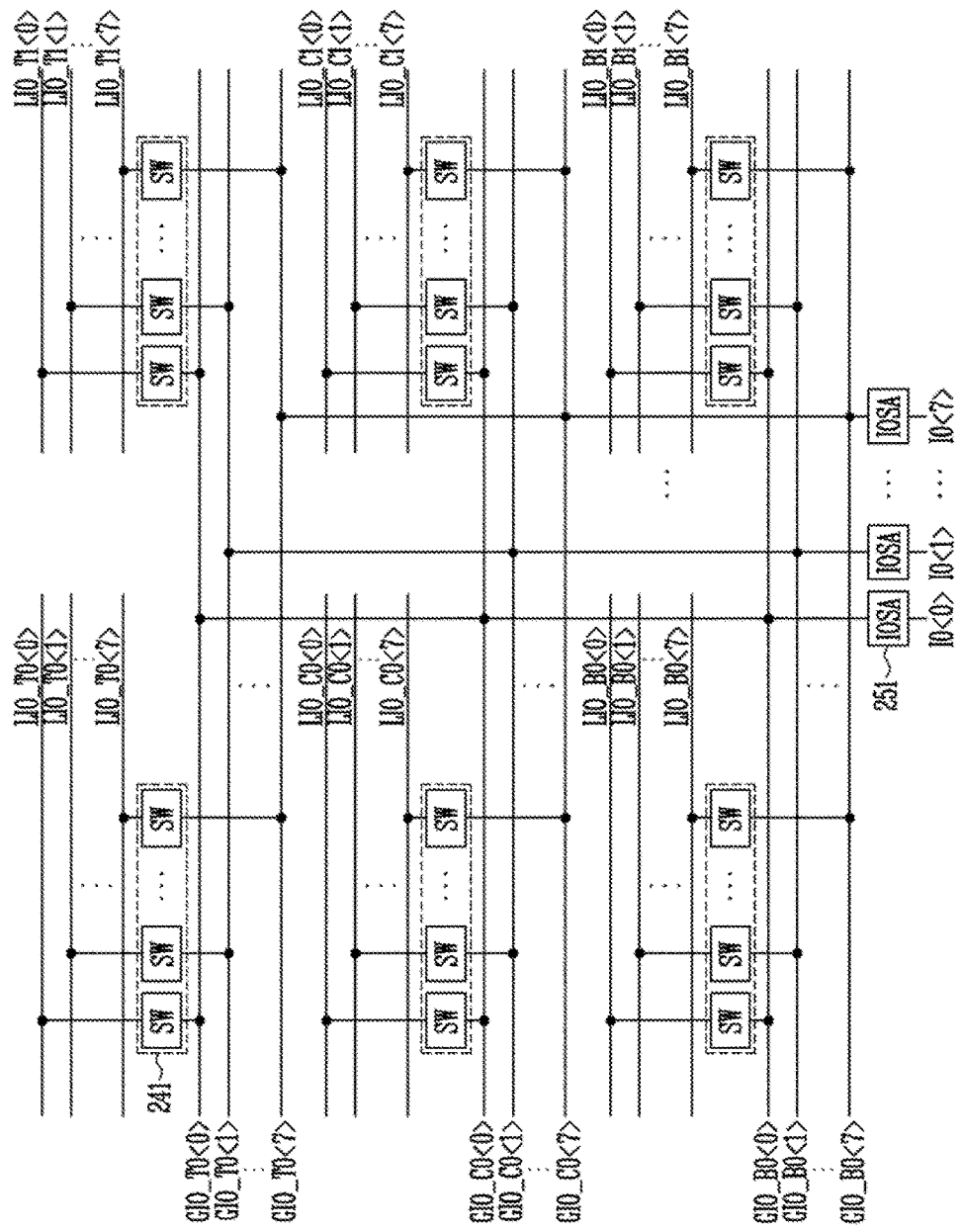

FIG. 9A

| Unit Block | 66+60+66=192 Byte |
|---|---|
| Main | 2048 Byte |
| Spare | 256 Byte |
| Main+Spare | 2304 Byte |
| BITOUT Load | 2304/192=12 |

FIG. 9B

Main 2KByte + Spare 256Byte

| UNIT [Byte] | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 |
|---|---|---|---|---|---|---|---|---|---|---|---|---|---|---|---|---|---|---|---|---|---|---|---|---|---|---|---|---|---|---|---|---|---|---|---|---|
| I/O [Byte] | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 66 | 66 | 60 | 35 |
| YDATA | 0 | 1 | 2 | 3 | 4 | 5 | 6 | 7 | 8 | 9 | 10 | 11 | 12 | 13 | 14 | 15 | 16 | 17 | 18 | 19 | 20 | 21 | 22 | 23 | 24 | 25 | 26 | 27 | 28 | 29 | 30 | 31 | 32 | 33 | 34 | 35 |

FIG. 9C

6B(48bit) * 11 = 66Byte
64Byte

6B(48bit) * 10 = 60Byte
64Byte

6B(48bit) * 11 = 66Byte
64Byte

66B + 60B + 66B = 192 Byte
192 Byte * 12 = 2KB + 256 Byte

MEMORY DEVICE INCLUDING PAGE BUFFER AND METHOD OF ARRANGING PAGE BUFFER HAVING CACHE LATCHES

CROSS-REFERENCE TO RELATED APPLICATION

The present application claims priority under 35 U.S.C. § 119(a) to Korean patent application number 10-2016-0062004, filed on May 20, 2016, the entire disclosure of which is incorporated herein by reference in its entirety.

BACKGROUND

Field of Invention

Various embodiments of the invention relate generally to a memory device and, more particularly to a memory device including a page buffer having an improved configuration, a method of arranging the page buffer in the memory device and a method of repairing a defect.

Description of Related Art

An increase in demand for digital devices such as cellular phones, portable memory devices and digital cameras leads to an increase in demand for non-volatile memory devices which are widely used as memory devices of these products. A NAND flash memory device, among these non-volatile memory devices, is widely used as a data storage device.

A NAND flash memory device typically includes a plurality of page buffers coupled to plurality of bit lines for performing necessary operations required in a read operation and for outputting data stored in the memory cells of the memory device.

Recently, as portability of digital devices has improved, data usage has gradually increased. Therefore, smaller, faster memory devices are in demand.

SUMMARY

Various embodiments are directed to a memory device including a page buffer having an improved configuration capable of reducing the size of the memory device, increasing data input and output speeds, and efficiently repairing a defect, and a method of arranging the page buffer.

According to an embodiment, A memory device according to an embodiment may include a memory cell array, a plurality of bit lines, and a plurality of page buffers including a plurality of cache latches, exchanging data with the memory cell array through the plurality of bit lines, wherein the plurality of cache latches are arranged in a column direction in parallel with the plurality of bit lines and a row direction perpendicular to the plurality of bit lines, and have a two-dimensional arrangement of M stages in the column direction, where M is a positive integer not corresponding to $2^L$ and L is zero or a natural number.

BRIEF DESCRIPTION OF THE DRAWINGS

The above and other features and advantages of the present invention will become more apparent to those skilled in the art to which the present invention pertains by the following detailed description of various embodiments thereof with reference to the accompanying drawings in which:

FIG. 3 is diagram illustrating an arrangement of page buffers shown in FIG. 1 and the connection relationship between the page buffers and bit lines, according to an embodiment of the present invention;

FIG. 4 is a diagram illustrating allocation of an input/output path IO and column selection code CS by a cache latch unit shown in FIG. 3, according to an embodiment of the present invention;

FIGS. 5A and 5B are diagrams illustrating examples of a method of repairing a defective cache latch, according to an embodiment of the invention;

FIG. 7 is a diagram illustrating the configuration of local input/output lines and column selection code of cache latches, according to an embodiment of the present invention;

FIG. 8 is a diagram illustrating a data output path, according to an embodiment of the present invention;

FIGS. 9A, 9B and 9C are diagrams illustrating examples of a method of configuring a page and a data chunk, according to an embodiment of the present invention;

DETAILED DESCRIPTION

Figure 1:
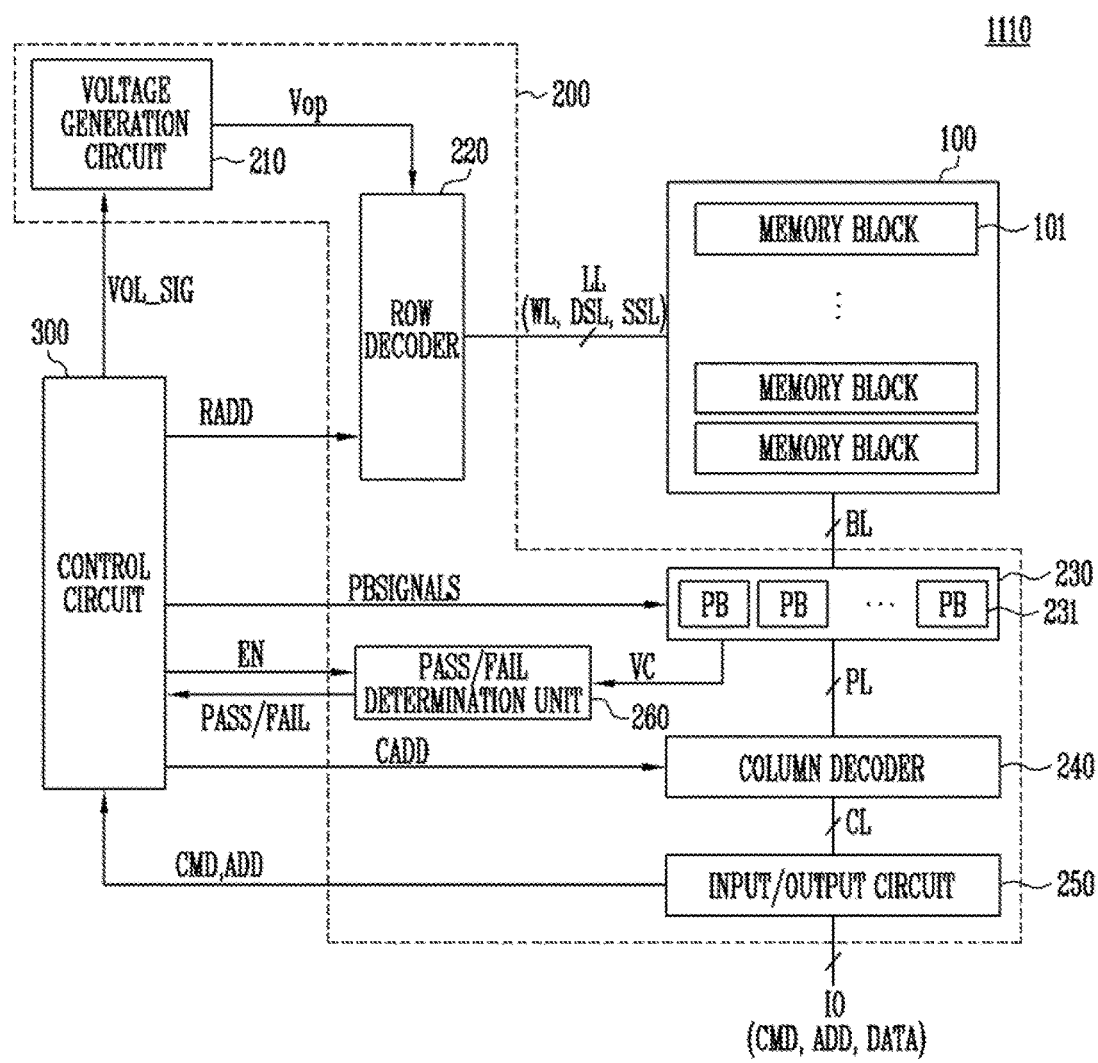
FIG. 1 is a diagram illustrating a memory device, according to an embodiment of the present invention.

Hereinafter, various exemplary embodiments will be described in detail with reference to the accompanying drawings. The present disclosure, however, may be embodied in various different forms, and should not be construed as being limited only to the illustrated embodiments set forth herein. Rather, these embodiments are provided as examples so that this disclosure will be thorough and complete, and will fully convey the various aspects and features of the present invention to those skilled in the art to which the present invention pertains.

In the drawings, the various components are not necessarily drawn to scale and the size of various components may be exaggerated for convenience of illustration.

Like reference numerals refer to like elements throughout the specification and drawings.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

It will be further understood that when an element is referred to as being "connected to", or "coupled to" another element, it may be directly on, connected to, or coupled to the other element, or one or more intervening elements may be present. In addition, it will also be understood that when an element is referred to as being "between" two elements, it may be the only element between the two elements, or one or more intervening elements may also be present.

Spatially relative terms, such as "under," "below," "lower," "above," "upper" and the like, may be used herein for ease of description to describe one element's relationship to another element or elements as illustrated in the figures. It will be understood that the spatially relative terms are intended to encompass different orientations of a device in manufacturing, use or operation in addition to the orientation depicted in the figures. For example, if the device is turned over, elements described as "below" or "under" other elements or features would then be "above" the other elements or features. The device may be otherwise oriented (rotated 90 degrees or at other orientations) and the spatially relative descriptors used herein interpreted accordingly.

The terminology used herein is for the purpose of describing particular embodiments only and is not intended to be limiting of the present invention.

As used herein, singular forms are intended to include the plural forms as well, unless the context clearly indicates otherwise.

It will be further understood that the terms "comprises," "comprising," "includes," and "including" when used in this specification, specify the presence of the stated elements and do not preclude the presence or addition of one or more other elements.

As used herein, the term "and/or" includes any and all combinations of one or more of the associated listed items.

Unless otherwise defined, all terms including technical and scientific terms used herein have the same meaning as commonly understood by one of ordinary skill in the art to which the present invention belongs in view of the present disclosure. It will be further understood that terms, such as those defined in commonly used dictionaries, should be interpreted as having a meaning that is consistent with their meaning in the context of the present disclosure and the relevant art and will not be interpreted in an idealized or overly formal sense unless expressly so defined herein.

In the following description, numerous specific details are set forth in order to provide a thorough understanding of the present invention. The present invention may be practiced without some or all of these specific details. In other instances, well-known process structures and/or processes have not been described in detail in order not to unnecessarily obscure the present invention.

It is also noted, that in some instances, as would be apparent to those skilled in the relevant art, an element (also referred to as a feature) described in connection with one embodiment may be used singly or in combination with other elements of another embodiment, unless specifically indicated otherwise.

Hereinafter, the various embodiments of the present invention will be described in detail with reference to the attached drawings.

Referring now to FIG. 1, a memory device 1110 is provided, according to an embodiment of the present invention.

The memory device 1110 includes a memory cell array 100 including a plurality of memory cells for storing data. The memory device 1110 also includes a peripheral circuit 200 which is configured to program data (i.e., store data) into the memory cell array 100, read the stored data and output the read data to an external device (e.g., a memory controller 3100 shown in FIG. 11), or erase data. The memory device 1110 further includes a control circuit 300 for controlling the peripheral circuit 200.

The memory cell array 100 may include a plurality of memory blocks 101. Local lines LL and bit lines BL may be coupled to each of the memory blocks 101. Each of the local lines LL may be coupled to a memory block 101. Each bit line BL may be coupled in common to the plurality of memory blocks 101. In addition, the memory cell array 100 may include a main data area (not shown) for storing user data and a spare area (not shown) for storing spare data. In an embodiment, the memory cell array 100 may be or include a two-dimensional array. In another embodiment, the memory cell array 100 may be or include a three-dimensional memory array in which a plurality memory cells are stacked in a vertical direction to a substrate. A three-dimensional array is advantageous because it allows arranging more memory cells more densely than a two-dimensional array. Each block may include a plurality of memory cells organized in pages. The memory cells may be nonvolatile memory cells. The memory cells may be NAND flash memory cells. The memory cells may be NOR flash memory cells. An example configuration of the memory array will be discussed in more detail in reference with FIG. 2.

The peripheral circuit 200 may include a voltage generation circuit 210, a row decoder 220, a page buffer unit 230, a column decoder 240, an input/output circuit 250 and a pass/fail determination unit 260.

The voltage generation circuit 210 may generate various operating voltages Vop applied to perform various operations such as a program, read or erase operation in response to a voltage generation signal VOL_SIG received from the control circuit 300. For example, the voltage generation circuit 210 may generate program voltages, pass voltages, read voltages and erase voltages having various voltage levels in response to the voltage generation signal VOL_SIG.

The row decoder 220 may provide the operating voltages Vop to the local lines LL coupled to a selected memory block in response to a row address RADD received from the control circuit 300. For example, the row decoder 220 may provide the operating voltages Vop to word lines WL among the local lines. The row decoder 220 may also provide the operating voltages Vop to a drain selection line DSL and a source selection line SSL coupled to the selected memory block in addition to the word lines WL.

The page buffer unit 230 may include a plurality of page buffers PB 231 coupled to the bit lines BL. The page buffers 231 may exchange data with the memory cell array 100 through the bit lines BL and temporarily store data transferred from the selected memory block in response to page buffer control signals PBSIGNALS received from the control circuit 300. The page buffer may be configured according to the configuration illustrated in FIG. 3, according to an embodiment of the present invention.

The column decoder 240 may receive data from the page buffers PB through page lines PL in response to a column address CADD received from the control circuit.

Figure 11:
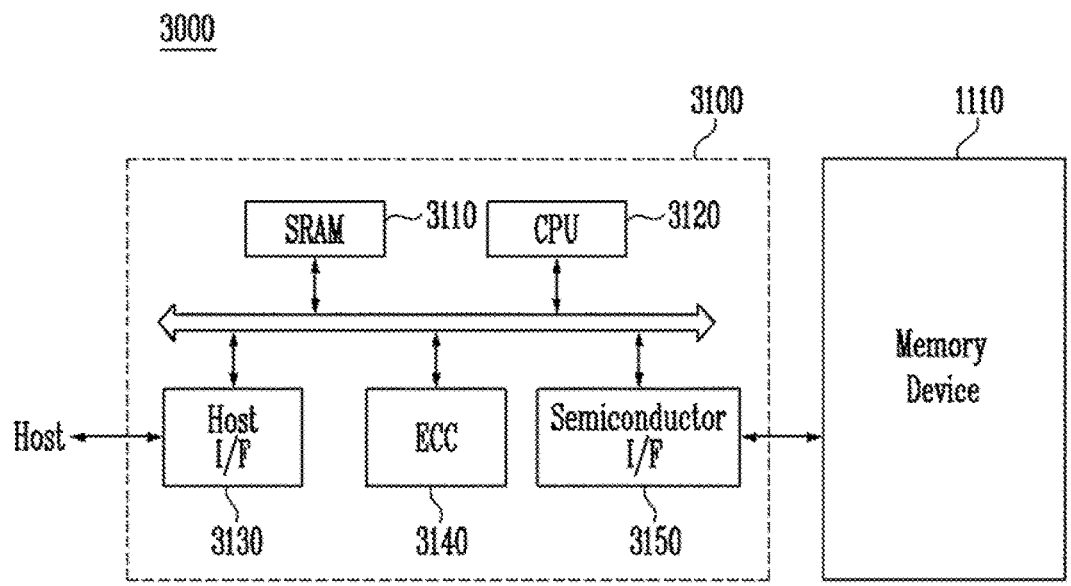
FIG. 11 is a diagram illustrating a memory system coupled to a host, the memory system including a memory device, according to an embodiment of the present invention.

The input/output circuit 250 may transfer a command CMD and an address ADD received through an input/output path IO from an external device (e.g., the controller 3100 of a memory system as shown in FIG. 11) to the control circuit 300, or exchange data with the column decoder 240 coupled through column lines CL.

The input/output path IO may include a plurality (e.g., $2^N$) of input/output pins, where N is a natural number greater than or equal to 2. In an embodiment, N may be equal to 3, that is, the input/output path IO may include eight input/output pins IO<0> to IO<7>.

The pass/fail determination unit 260 may determine pass or fail with respect to an operation being performed, depending on a voltage VC or current received from the page buffer unit 230 in response to an enable signal EN from the control circuit, and transfer a pass signal PASS or a fail signal FAIL to the control circuit 300.

The control circuit 300 may output the voltage generation signal VOL_SIG, the row address RADD, the page buffer control signal PBSIGNALS, the enable signal EN and the column address CADD in response to the command CMD and the address ADD to thereby control the peripheral circuit 200.

Figure 2:
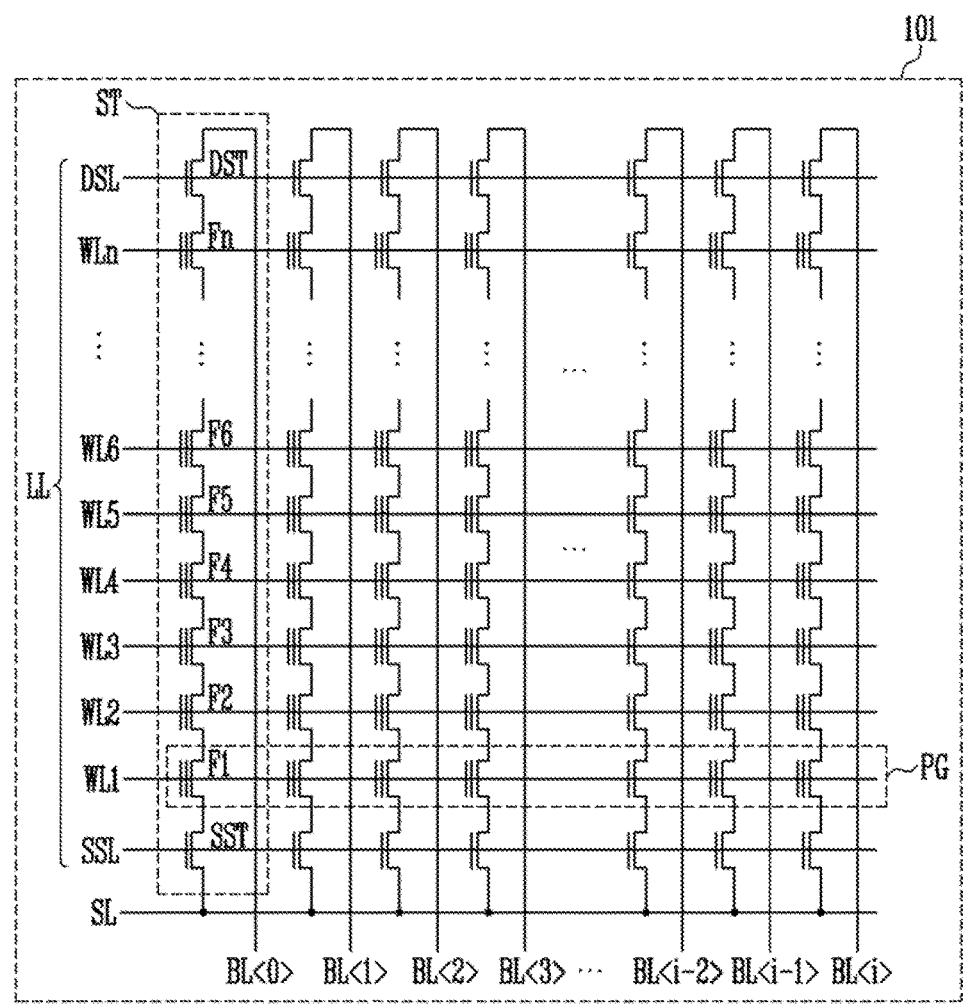
FIG. 2 is a circuit diagram illustrating a memory block of the memory device shown in FIG. 1.

FIG. 2 illustrates a detailed configuration of a memory block 101 of the memory device 1110 shown in FIG. 1. FIG. 2 shows the connection relationship between the memory block 101 and the bit lines BL.

Referring to FIG. 2, the memory block 101 may include a plurality of memory cell strings ST, each memory string ST being coupled between a respective bit line among the plurality of the bit lines BL<0> to BL<i> and a common source line SL, where i is a positive integer. As illustrated the number of memory cell strings may equal the number of bit lines. A memory cell string coupled to one of the above bit lines, for example, a memory cell string ST coupled to the bit line BL<0> is described below in more detail as an example.

The memory cell string ST may include a source selection transistor SST, first to nth memory cells F1 to Fn and a drain selection transistor DST which are coupled in series in the recited order between the common source line SL and the bit line BL<0>, where n is a positive integer. A gate of the source selection transistor SST is coupled to the source selection line SSL. The respective gates of the first to nth memory cells F1 to Fn are coupled to respective first to nth word lines WL1 to WLn. A gate of the drain selection transistor DST is coupled to the drain selection line DSL. A group of memory cells which are coupled to different strings ST and which are sharing a single word line are referred to as a page PG. For example, a single page may include as many memory cells as 8 kByte. In addition, each page PG may include a plurality of logical pages by a method of programming the first to nth memory cells F1 to Fn. For example, multi level cells MLC may include two logical pages, triple level cells TLC may include three logical pages, and quadruple level cells QLC may include four logical pages. The source selection transistor SST, the first to nth memory cells F1 to Fn and the drain selection transistors DST may be stacked in a vertical direction to a substrate. The structure illustrated in FIG. 2 may be repeated multiple times to form a three-dimensional memory array which allows packing more densely more memory cells in the memory device. In an embodiment, the memory device of FIGS. 1 and 2 may be a NAND flash memory.

FIG. 3 is a diagram illustrating the arrangement of page buffers 230 shown in FIG. 1 and the connection relationship between the page buffers 230 and the bit lines BL.

Referring to FIG. 3, the page buffer unit 230 may include a sensing/latch unit 230(a) and a cache latch unit 230(b). The sensing/latch unit 230(a) may include a plurality of sensing/latch circuits 231(a). The cache latch unit 230(b) may include a plurality of cache latches 231(b). The plurality of sensing/latch circuits 231(a) included in the sensing/latch unit 230(a) may be arranged adjacent to each other in rows (horizontal stages) and columns (vertical stages). Likewise, the plurality of cache latches 231(b) included in the cache latch unit 230(b) may be arranged adjacent to each other in rows (horizontal stages) and columns (vertical stages). In addition, the sensing/latch unit 230(a) which is directly coupled to the bit lines BL is physically closer to the memory cell array 100 than the cache latch unit 230(b). By this arrangement, the cache latch unit 230(b) may be closer to the input/output path shown in FIG. 1, so that a data output speed may be increased.

Each of the page buffers 231 shown in FIG. 1 may include at least one sensing/latch circuit 231(a) and at least one cache latch 231(b). Each sensing/latch circuit 231(a) may exchange data with a memory cell string ST of the memory cell array 100 through a bit line BL. As illustrated in FIG. 3, each sensing/latch circuit 231(a) is coupled to a single bit line. This architecture may be referred to hereinafter as an "all BL" architecture. According to another embodiment (not shown) a single sensing/latch circuit 231(a) may be coupled to at least two bit lines, an architecture which may be referred to as a "shielded BL" architecture. Referring now to the "all BL" architecture of FIG. 3, where the single sensing/latch circuit 231(a) is coupled to a single bit line and assuming that a single page stores 8 kByte data, the page buffer unit 230 may include as many sensing/latch circuits 231(a) as the number of memory cells storing the 8 kByte data.

Moreover, as illustrated in FIG. 3, each sensing/latch circuit 231(a) is coupled to a single cache latch 231(b) through a single data line DL so that they may exchange data with each other. When the memory device 1110 as shown in FIG. 1 receives a read command, data stored in the memory cell array 100 shown in FIG. 1 may be read by a sensing/latch circuit 231(a), temporarily stored therein, and then transferred through the data line DL to be stored in a cache latch 231(b). The data stored in the cache latch 231(b) may pass through the column decoder 240 and the input/output circuit 250 and then transferred to an external device in response to a data output command which is externally inputted through the input/output path IO.

The sensing/latch circuits 231(a) and the cache latches 231(b) may be two-dimensionally arranged due to a decrease in pitch between the bit lines caused by fine manufacturing processes. The size of a memory device may be increased as the number of stages in a column direction in parallel with the bit lines increases. As a result, manufacturing costs may increase. For example, when eight stages arranged in the column direction is reduced to six stages, the size of the memory device may be reduced. In this example, the remaining two stages may be arranged in a row direction perpendicular to the bit lines.

Referring to FIG. 3, the plurality of sensing/latch circuits 231(a) included in the sensing/latch unit 230(a) may be two-dimensionally arranged. The plurality of sensing/latch circuits 231(a) may be arranged in six stages Stage<0> to Stage<5> in the column direction in parallel with the bit lines. In addition, the plurality of cache latches 231(b) included in the cache latch unit 230(b) may be two-dimensionally arranged. The plurality of sensing/latch circuits 231(b) may be arranged in six stages Stage<0> to Stage<5>) in the column direction as illustrated in FIG. 3.

The plurality of cache latches 231(b) may be arranged in the column direction in parallel with the plurality of bit lines BL and a row direction perpendicular to the plurality of bit lines BL. In an embodiment, the plurality of cache latches 231(b) may have a two-dimensional arrangement of M stages in the column direction, where M is a positive integer not corresponding to $2^L$ and L is zero or a natural number.

FIG. 4 is a diagram illustrating an arrangement of the input/output path IO of the cache latch unit 230(b) shown in FIG. 3 and column selection code.

Referring to FIG. 4, when the cache latches 231(b) are arranged in the six stages Stage<0> to Stage<5> in the column direction, unit cache blocks 400, each including forty-eight cache latches 231(b), may be repetitively arranged. The number of cache latches 231(b) and the number of unit cache blocks 400 as shown in FIG. 4 are provided as examples for explaining the present invention, and it should be understood that the present invention is not limited thereto. The input/output path IO may include $2^N$ input/output pins, where N is a natural number of 2 or more. In some embodiments, the input/output path IO may include eight input/output pins IO<0> to IO<7> as illustrated in FIG. 4. Specifically, FIG. 4 shows an example of how the cache latches 231(b) may input or output data, through the eight input/output pins IO<0> to IO<7>. On the assumption that even cache latches 231(b) coupled to even bit lines are even numbered 'Even#' and odd cache latches 231(b) coupled to odd bit lines are odd numbered 'Odd#' where # is an integer greater than or equal to zero, the even numbered cache latches Even# may be coupled to the eight input/output pins IO<0> to IO<7>, respectively, in order in which their number # increases, and exchange data. In addition, the odd numbered cache latches Odd# may be coupled to the eight input/output pins IO<0> to IO<7>, respectively, in order in which their number # increases, and exchange data. For example, when the eight even cache latches Even0 to Even7 or the odd cache latches Odd0 to Odd7 are allocated to the eight input/output pins IO<0> to IO<7>, the eight even or odd cache latches Even0 to Even7 or Odd0 to Odd7 may form a single input/output cache latch group.

When it is assumed that a first cache latch group 401 includes sixteen cache latches, the eight even cache latches Even0 to Even7 and the eight odd cache latches Odd0 to Odd7 may be included in the first cache latch group 401. The eight even cache latches Even0 to Even7 in the first cache latch group 401 may form a single column selection code (e.g., CS<0>). The eight odd cache latches Odd0 to Odd7 may also form a single column selection code (e.g., CS<1>). In other words, the first cache latch group 401 may include two column selection codes. A column selection code may be included in the column address CADD shown in FIG. 1. Data stored in the eight cache latches included in the single column selection code may simultaneously and in parallel pass through the column decoder 240 and be outputted.

As shown in FIG. 4, the arrangement of the first cache latch group 401, the second cache latch group 402 and the third cache latch group 403 may each form a shape of a concave polygon which together form a complete rectangular shape, since the cache latches are arranged in a total of six stages Stage<0> to Stage<5> in the column direction and the input/output paths IO as shown in FIG. 1 are allocated in increasing order in the column direction. Referring to FIG. 4, each of the cache latches arranged in Stage<0> may include one or more cache latches coupled to the input/output pins IO<0> to IO<7>, respectively. The same applies to Stage<1> to Stage<5>. The arrangement of the cache latches in the six stages Stage<0> to Stage<5> in the column direction may reduce a layout area of the page buffer unit in comparison with the arrangement of cache latches in eight stages in the column direction, so that the size of the memory device may be reduced. However, since cache latches included in a single stage may be coupled to a plurality of input/output pins, a data output path having a different configuration from the arrangement of the cache latches in the total of eight stages in the column direction is required.

Referring to FIG. 4, the unit cache blocks 400 may have a rectangular shape in a two-dimensional arrangement. This rectangular arrangement may be formed when three cache latch groups, i.e., the first cache latch group 401, the second cache latch group 402 and the third cache latch group 403 are arranged adjacent to each other. A minimum number of cache latch groups defining a two-dimensional rectangular arrangement of cache latches may be referred to as a unit cache latch block. For the illustrated example of FIG. 4, wherein the cache latches are arranged in six stages in the column direction and the input/output paths IO are allocated according to increasing order in the column direction, a group of forty eight cache latches constitutes a unit cache latch block.

For example, as for cache latches arranged in six stages in the column direction and the input/output paths IO allocated according to increasing order in the column direction, the arrangement of eight cache latches constituting a single column selection code may not be defined by a single stage in the column direction or a single stage in the row direction, but may be distributed across a plurality of stages in the row direction and the column direction. In other words, it may be seen that the cache latches Even0 to Even7 in the first cache latch group 401 are distributed in three stages (i.e., Stage<0>, Stage<2>, and Stage<4>) in the column direction parallel to the bit lines and three stages in the row direction perpendicular to the bit lines. The cache latches Odd0 to Odd7 in the first cache latch group 401 may be distributed in a similar manner in three stages in the column direction parallel to the bit lines (i.e., Stage<1>, Stage<3> and Stage<5>) and three stages in the row direction perpendicular to the bit lines.

Referring to FIGS. 3 and 4, one of the bit lines coupled to the cache latches Even0 to Even7 in the first cache latch group 401 and one of the bit lines coupled to the cache latches Odd0 to Odd7 in the first cache latch group 401 may alternate with each other. In other words, the bit line BL<0> coupled to the cache latch Even0 in the first cache latch group 401 and the bit line BL<1> coupled to the cache latch Odd0 in the first cache latch group 401 may be arranged adjacent to each other. The bit line BL<2> coupled to the cache latch Even1 in the first cache latch group 401 and the bit line BL<1> coupled to the cache latch Odd0 in the first cache latch group 401 may be arranged adjacent to each other.

In an operation of reading data stored in the page PG as shown in FIG. 2, the data may be read by enabling the even bit lines Even BL coupled to the even cache latches and the odd bit lines Odd BL coupled to the odd cache latches at the same time. In this example, when the number of cells forming a single page corresponds to 8 kByte, data of 8 kByte may be simultaneously read. According to another embodiment, a read operation may be performed by enabling bit lines coupled to either even cache latches or odd cache latches. When the number of cells forming a single page corresponds to 8 kByte, data of 4 kByte may be simultaneously read. The even bit lines Even BL or the odd bit lines Odd BL which do not perform a read operation may maintain a ground voltage GND when the selected bit lines are enabled, so that noise occurring during the read operation may be reduced. As a result, when the read operation is performed by enabling either the even bit lines Even BL or the odd bit lines Odd BL, faster read performance may be achieved in comparison with a read operation performed by enabling both the even bit lines Even BL and the odd bit lines Odd BL.

FIGS. 5A and 5B are diagrams illustrating examples of a repair method of a defective cache latch, according to an embodiment of the present invention.

A process defect may occur in a predetermined bit line due to impurity particles formed during manufacturing processes of a memory device. As a result, bad data may be transferred to a cache latch during a read operation to cause a read error. Thus, to prevent this read error, repair cache latches may be provided in the memory device to repair a cache latch to which the bad data is transferred. By repairing the cache latch to which the bad data is transferred during the read operation by a repair cache latch, data stored in the defective cache latch are not outputted but the data stored in the repair cache latch are outputted instead. This operation is called column repair.

In addition, as fine manufacturing processes are performed, bit lines close to each other may become defective together. To improve efficiency of repairing the defective cache latch, the above-described column repair may be performed on a plurality of cache latches at the same time. A group of the plurality of cache latches being replaced by repair cache latches may be a repair cache latch unit. When one bit line in a single column selection code CS is defective, this repair cache latch unit may be implemented so that a cache latch in the corresponding column selection code and corresponding cache latches in column selection code including cache latches adjacent to bit lines coupled thereto may be replaced with repair cache latches. In other words, in a memory device including eight input/output pins, when one cache latch is defective, all sixteen cache latches may be replaced by repair cache latches.

Referring to FIG. 5A, when one defective cache latch occurs in the first cache latch group 401 of the cache latch unit 230(b), all cache latches in the first cache latch group 401 may be replaced by repair cache latches. In the same manner, when one defective cache latch occurs in the second cache latch group 402, all cache latches in the second cache latch group 402 may also be replaced by repair cache latches. In other words, a cache latch group including sixteen cache latches may be a repair cache latch unit.

According to an embodiment, when a defective particle DP occurs during allocation of the input/output path as shown in FIG. 5A, a total of seven bit lines BL<1> to BL<7> may become defective bit lines. A read error may be solved by replacing all sixteen cache latches in the first cache latch group 401 with repair cache latches.

According to another embodiment, when a defective particle DP occurs during allocation of the input/output path as shown in FIG. 5B, a total of four bit lines BL<1> to BL<4> may become defective bit lines. A read error may not be solved by replacing sixteen cache latches in the fourth cache latch group 404 of the cache latch unit 230(d) with repair cache latches. Although the bit line BL<1> is coupled to the cache latch included in the fourth cache latch group 404, the bit lines BL<2> and BL<3> which are also defective may be coupled to the cache latch included in the fifth cache latch group 405, and the bit line BL<4> may be coupled to the cache latch included in the sixth cache latch group 406. Thus, the read error may be solved when the sixteen cache latches included in the fifth cache latch group 405 and the sixteen cache latches included in the sixth cache latch group 406 as well as the sixteen cache latches included in the fourth cache latch group 404 are replaced by repair cache latches. In other words, the read error may be solved when a total of forty-eight cache latches are repaired. In comparison with the method shown in FIG. 5A, the read error may be solved when more cache latches are replaced by repair cache latches although defective bit lines are smaller. Such difference may result from an input/output path allocating method. In other words, in comparison with the method shown FIG. 5B where eight cache latches included in a single column selection code are arranged at one stage in a column direction, the method shown in FIG. 5A where cache latches are arranged in both row and column directions may have higher repair efficiency.

Referring again to FIG. 5A, the arrangement of the group of cache latches which are repaired at the same time may not have a two-dimensional rectangular shape since an input/output path is allocated in increasing order in the column direction. As illustrated in FIG. 5B, when cache latches constituting a single column selection code are arranged in one stage in the column direction, the cache latches which are repaired at the same time may have a two-dimensional arrangement in a rectangular shape.

Figure 6:
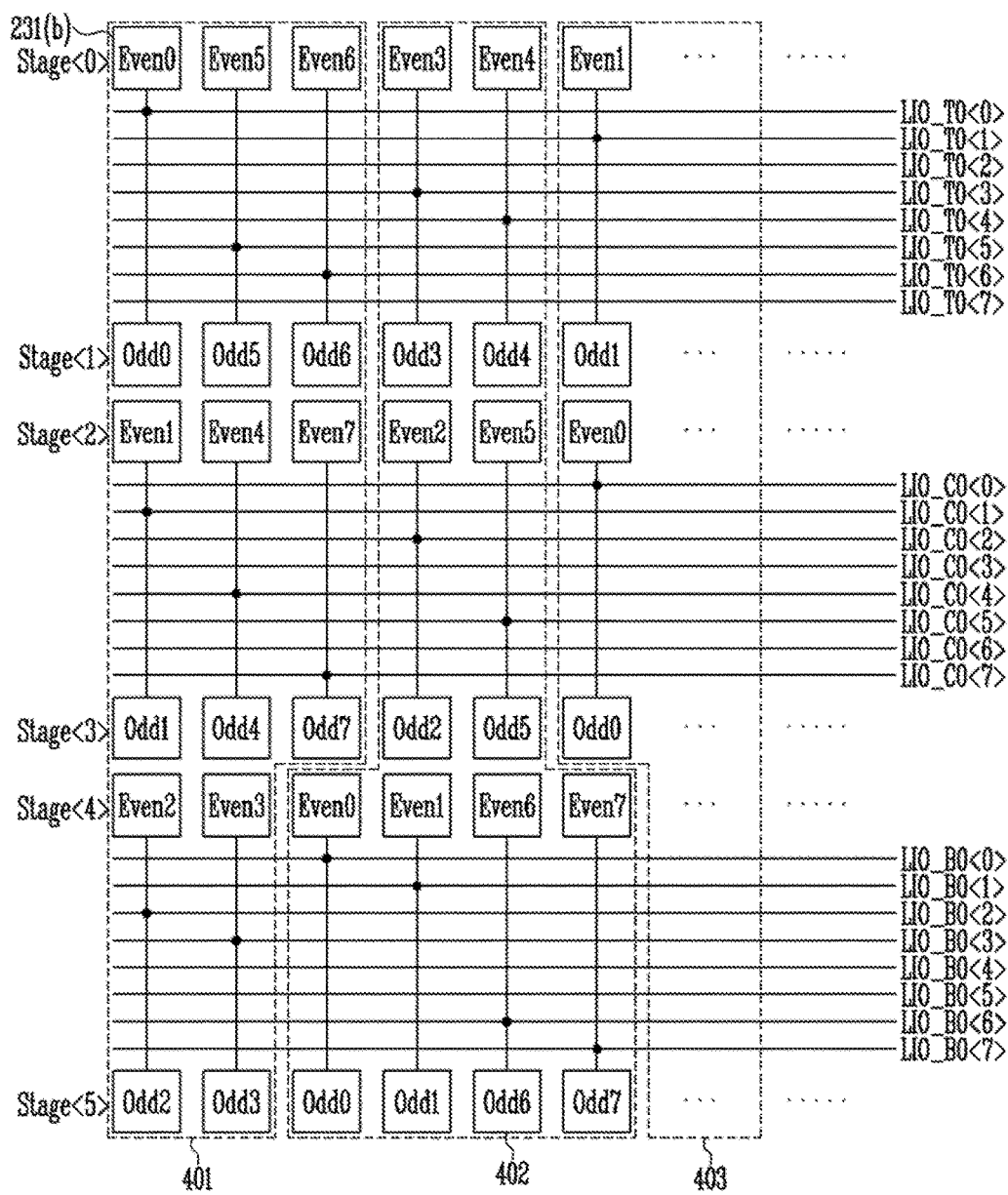
FIG. 6 is a diagram illustrating the configuration of local input/output lines and the connection relationship between a cache latch unit shown in FIG. 3 and local input/output lines, according to an embodiment of the present invention.

FIG. 6 is a diagram illustrating the configuration of a plurality of local input/output lines LIO and the connection relationship between a cache latch unit 231(b) shown in FIG. 3 and local input/output lines LIO.

Referring to FIG. 6, the plurality of local input/output lines LIO may be included in the page lines PL shown in FIG. 1. A pair of an even cache latch and an odd cache latch (i.e., a cache latch allocated to the same input/output pin) may be coupled in common to a single local input/output line. In addition, as described above with reference to FIG. 4, cache latches may be coupled to IO<0> to IO<7> at each of the six stages Stage<0> to Stage<5> in the column direction. Therefore, as can be seen from FIG. 6, eight local input/output lines LIO_T0<0> to LIO_T0<7> may be coupled to cache latches Stage<0> to Stage<1>. In addition, LIO_C0<7:0> may be coupled to the Stage<2> and Stage<3>, and LIO_B0<7:0> may be coupled to Stage<4> and Stage<5>.

Data output time may vary depending on the physical arrangement of the local input/output lines LIO. For example, when the local input/output lines LIO_T0<0> to LIO_T0<7> are arranged above the cache latches of Stage<0> or Stage<1>, or therebetween, the data output time may be decreased. The local input/output lines LIO_C0<0> to LIO_C0<7> may be arranged above the cache latches of Stage<2> or Stage<3>, or therebetween. The local input/output lines LIO_B0<0> to LIO_B0<7> may be arranged above the cache latches of Stage<4> or Stage<5>.

FIG. 7 is a diagram illustrating the configuration of local input/output lines LIO and column selection code CS according to an embodiment.

Referring to FIG. 7, local input/output lines LIO may be divided into sixty-four column selection codes, i.e., a 64 Byte cache latch unit. The connection of these local input/output lines LIO may cause an increase in data output speed since loading is reduced when data is output. As for the configuration of the total of six stages in the column direction as described above, the unit cache block 400 may include forty-eight cache latches. When cache latches corresponding to 64 Byte are arranged, a two-dimensional rectangular arrangement may not be realized since 64 Byte is not an integer multiple of 48 bit. Instead, the configuration of 66 Byte in 500 and the configuration of 60 Byte in 501, a rectangular arrangement may be obtained. When a single unit cache latch block is formed using 66 Byte of 500, 60 Byte of 501, and 66 Byte of 502, this unit cache block may be two-dimensionally arranged in a rectangular shape, and column selection code of CS<191:0> may be configured as in 600, 601, and 602. The local input/output lines LIO may be arranged in unit of 64 Byte. In this example, as shown in FIG. 6, LIO_T or LIO_C and LIO_B may be slightly misaligned with each other. In other words, the number of cache latches coupled to LIO_T or LIO_C may be different from the number of cache latches coupled to LIO_B. A unit cache latch block which is the basic unit of the arrangement of the local input/output lines may include 192 column selection codes, i.e., cache latches of 192 Byte.

FIG. 8 is a diagram illustrating a data output path according to an embodiment.

Referring to FIG. 8, the local input/output lines LIO may be coupled to switch circuits SW corresponding thereto, and outputs of the respective switch circuits may be coupled to global input/output lines GIO corresponding thereto. Each of a plurality of switching units 241 may include eight switch circuits SW, and the plurality of switching units 241 may be included in the column decoder 240 shown in FIG. 1. Switching unit 241 may be a multiplexer. As described above, the local input/output lines LIO may be configured in a 64 Byte unit. The global input/output lines GIO may be coupled in common across a single page. This single page may have a size of 8 kByte. The column lines CL as shown in FIG. 1 may include a plurality of global input/output lines GIO.

Global input/output lines GIO_T<7:0> coupled to Stage<0> and Stage<1> may be arranged above the cache latches physically arranged in Stage<0> or Stage<1>, or therebetween. In addition, the switching units 241 corresponding to the global input/output lines GIO_T may be located between the cache latches arranged in Stage<0> and the cache latches arranged in Stage<1>. In the same manner, switching units 241 corresponding to global input/output lines GIO_C may be arranged between cache latches arranged in Stage<2> and cache latches arranged in Stage<3>. Such arrangement may reduce loading during a data output operation to reduce a data output speed.

Among the global input/output lines GIO_T<7:0> coupled to the cache latches arranged in Stage<0> and Stage<1>, the global input/output lines GIO_C<7:0> coupled to the cache latches arranged in Stage<2> and Stage<3>, and global input/output lines GIO_B<7:0> coupled to the cache latches coupled to Stage<4> and Stage<5>, global input/output lines coupled in common to one input/output pin of the input/output path IO may be coupled to each other before a single input/output sense amplifier (IOSA) 251 is input, and coupled in common to the single input/output sense amplifier (IOSA) 251 when being coupled to each other. The input/output circuit 250 shown in FIG. 1 may include a plurality of input/output sense amplifiers 251. Each of the plurality of input/output sense amplifiers 251 may be coupled to each of the input/output pins IO<7:0>.

During a data output operation, each of the plurality of switching units 241 coupled to the global input/output lines GIO_T<7:0>, GIO_C<7:0> and GIO_B<7:0> may be sequentially selected in response to the column address CADD shown in FIG. 1. The column address CADD may include the column selection code CS. The switches SW included in the selected switching units 241 may be turned on during a select period, and the local input/output line and the global input/output line may be electrically connected to the turned-on switches SW. In addition, the switches SW included in the unselected switching units 241 may be turned off. The local input/output line LIO coupled to the turned-off switch may be electrically disconnected from the global input/output line GIO.

FIGS. 9A, 9B and 9C are diagrams illustrating examples of a method of forming a page and a data chunk according to an embodiment.

Referring to FIG. 9A, in the arrangement of cache latches as shown in FIG. 4, 192 Byte may form a single unit cache latch block Unit Block as shown in FIG. 7. As described above, the unit cache latch block may have a two-dimensional arrangement in a rectangular shape. One data chunk may have a total of 2304 Byte consisting of a main data area Main of 2 kByte (or 2048 Byte) and a spare area Spare of 256 Byte. One data chunk, i.e., 2304 Byte may be an integer multiple of 192 Byte which corresponds to the size of the unit cache latch block Unit Block.

FIG. 9B is a diagram illustrating the connection relationship between a local input/output line and a unit cache latch block as described above. A detailed description thereof will be omitted.

FIG. 9C illustrates the arrangement of cache latches in the main data area and the spare area. As described above, when the main data area includes 2 kByte (or 2 KB) and the spare area includes 256 Byte, one chunk Main_Spare may include a total of 2304 Byte, which may be an integer multiple of 192 Byte corresponding to the size of the unit cache latch block Unit Block. Cache latches included in one chunk may have a rectangular arrangement as shown in FIG. 9.

Figure 10:
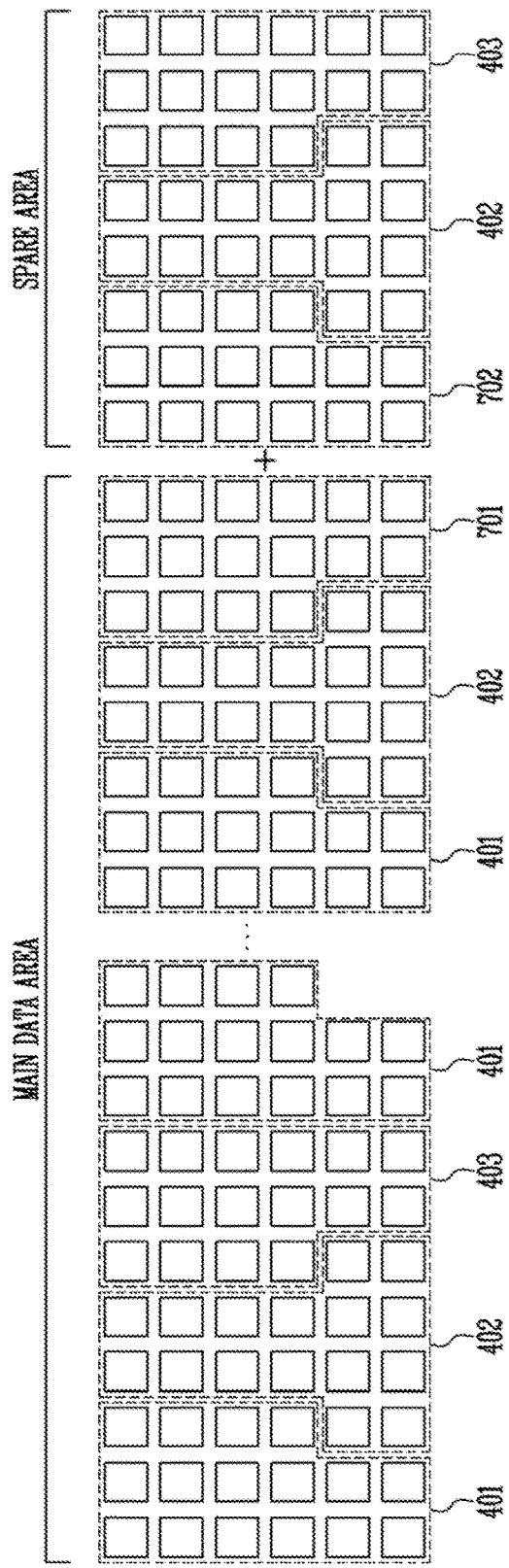
FIG. 10 is a diagram illustrating an arrangement of cache latches corresponding to a main area of a cell array shown in FIG. 1 and an arrangement of cache latches corresponding to a spare area of the cell array, according to an embodiment of the present invention.

FIG. 10 is a diagram illustrating the arrangement between cache latches corresponding to a main area of a memory cell array 100 shown in FIG. 1 and cache latches corresponding to a spare area thereof.

Referring to FIG. 10, when the main data area corresponds to 2048 Byte as shown in FIG. 9, as for the arrangement of the cache latches as shown in FIG. 4, 192 Byte may form a single unit cache latch block. Therefore, when 2048 Byte is arranged, one end of the arrangement may remain empty as in 701 as shown in FIG. 10. In other words, the arrangement of the cache latches included in the main data area of 2048 Byte may not have a two-dimensional rectangular shape. In this example, the size of the spare area may be determined so as to be an integer multiple of 192 Byte corresponding to the size of a single unit cache latch block obtained by adding the main data area and the spare area. When the spare area has a size of 256 Byte as shown in FIG. 9, the sum of the main data area and the spare area may be 2304 Byte, which may be an integer multiple of 192 Byte corresponding to a unit block size. Therefore, the cache latches included in the main data area and the spare area may have a rectangular arrangement.

FIG. 11 is a block diagram illustrating a memory system 3000 including a memory device 1110 according to an embodiment.

Referring to FIG. 11, since the memory device 1110 may have substantially the same configuration as shown in FIG. 1, a detailed description thereof may be omitted.

The control unit 3100 may be configured to control the memory device 1110. A static random access memory (SRAM) 3110 may be used as a working memory of a central processing unit (CPU) 3120. A host interface (I/F) 3130 may include a data exchange protocol of a host electrically coupled with the memory system 3000. An error correction code (ECC) circuit 3140 in the control unit 3100 may detect and correct an error in data read from the memory device 1110. A semiconductor interface (I/F) 3150 may interface with the memory device 1110. The CPU 3120 may perform a control operation for data exchange of the memory control unit 3100. In addition, although not illustrated in FIG. 11, a read only memory (ROM) (not shown) for storing code data for interfacing with a host may be provided in the memory system 3000.

In an embodiment, the memory system 3000 may be applied to one of a computer, an Ultra Mobile PC (UMPC), a workstation, a net-book, a personal digital assistant (PDA), a portable computer, a web tablet, a wireless phone, a mobile phone, a smartphone, a digital camera, a digital audio recorder, a digital audio player, a digital picture recorder, a digital picture player, a digital video recorder, a digital video player, a device of transmitting and receiving information in a wireless environment, and various devices constituting a home network.

Figure 12:
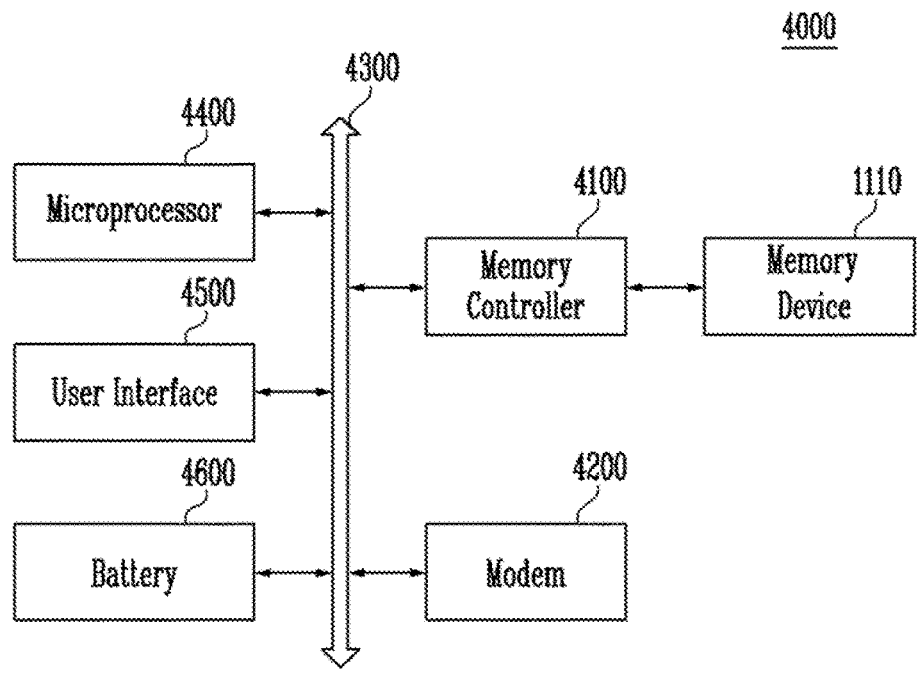
FIG. 12 is a diagram illustrating a computing system including a memory device, according to an embodiment of the present invention.

FIG. 12 is a block diagram illustrating a computing system 400 including a memory device 1110 according to an embodiment.

Referring to FIG. 12, the computing system 4000 includes an embodiment of the memory device 1110, a memory controller 4100, a modem 4200, a microprocessor 4400, and a user interface 4500, which are electrically coupled to a bus 4300. When the computing system 4000 is a mobile device, a battery 4600 for supplying an operation voltage of the computing system 4000 may be additionally provided. The computing system 4000 may include an application chip set (not shown), a camera image processor (CIS) (not shown), a mobile dynamic random access memory (DRAM) (not shown), and the like.

The memory device 1110 may be configured in substantially the same manner as the memory device 1110 shown in FIG. 1. Thus, a detailed description thereof will be omitted.

The memory controller 4100 and the memory device 1110 may be components of a Solid State Drive/Disk (SSD).

The memory device 1110 and the memory controller 4100 may be mounted using various types of packages. For example, the memory device 1110 and the memory controller 4100 may be mounted using packages such as Package on Package (PoP), Ball Grid Arrays (BGAs), Chip Scale Packages (CSPs), Plastic Leaded Chip Carrier (PLCC), Plastic Dual In-Line Package (PDIP), Die in Waffle Pack, Die in Wafer Form, Chip On Board (COB), Ceramic Dual In-Line Package (CERDIP), Plastic Metric Quad Flat Pack (MQFP), Thin Quad Flat Pack (TQFP), Small Outline (SOIC), Shrink Small Outline Package (SSOP), Thin Small Outline (TSOP), System In Package (SIP), Multi Chip Package (MCP), Wafer-level Fabricated Package (WFP), Wafer-level Processed Stack Package (WSP), and the like.

According to embodiments, the size of a memory device may be reduced and data input and output speeds may be increased by changing an arrangement of a page buffer. The size of the memory device may be reduced and an operating speed thereof may be improved.

It will be apparent to those skilled in the art that various modifications can be made to the above-described exemplary embodiments of the present invention without departing from the spirit or scope of the invention. Thus, it is intended that the present invention cover all such modifications provided they come within the scope of the appended claims and their equivalents.

What is claimed is:

1. A memory device, comprising:
    a memory cell array;
    a plurality of bit lines; and
    a plurality of page buffers including a plurality of cache latches, exchanging data with the memory cell array through the plurality of bit lines,
    wherein the plurality of cache latches including even and odd cache latches are arranged in a column direction in parallel with the plurality of bit lines and a row direction perpendicular to the plurality of bit lines, and have a two-dimensional arrangement of M stages in the column direction, where M is a positive integer not corresponding to $2^L$ and L is zero or a natural number,
    wherein the stages include a plurality of pairs of the even and odd cache latches, each of the pairs is coupled to a local input/output line,
    wherein the cache latches are included in a plurality of input/output cache latch groups according to column selection codes,
    wherein when at least one of the cache latches included in one of the input/output cache latch groups is defective, all of the cache latches included in the input/output cache latch group including the defective cache latch are repaired.

2. The memory device of claim 1, wherein each of the plurality of cache latches is coupled to one of $2^N$ input/output pins, where N is a natural number of 2 or more,
    $2^N$ cache latches coupled to the input/output pins, respectively, among the plurality of cache latches, form a single input/output cache latch group, among the input/output cache latch groups, configuring a single column selection code,
    data stored in the single input/output cache latch group are in parallel and simultaneously output through the $2^N$ input/output pins during a data output operation, and
    the single input/output cache latch group has a two-dimensional arrangement in the column direction and the row direction.

3. The memory device of claim 2, wherein the plurality of bit lines include even bit lines and odd bit lines alternating with each other.

4. The memory device of claim 3, further comprising:
    a first input/output cache latch group including $2^N$ cache latches corresponding to $2^N$ bit lines included in the even bit lines and corresponding to the $2^N$ input/output pins, respectively; and
    a second input/output cache latch group including $2^N$ cache latches corresponding to $2^N$ bit lines adjacent to the $2^N$ bit lines, among the even bit lines, and corresponding to the $2^N$ input/output pins, respectively.

5. The memory device of claim 4, wherein one of the $2^N$ cache latches included in the first input/output cache latch group coupled in common to one of the input/output pins and one of the $2^N$ cache latches included in the second input/output cache latch group are arranged adjacent to each other in the column direction of the two-dimensional arrangement.

6. The memory device of claim 5, wherein a first cache latch group including the first input/output cache latch group and the second input/output cache latch group has a two-dimensional arrangement not in a rectangular shape.

7. The memory device of claim 6, wherein all cache latches included in the first cache latch group are simultaneously repaired when at least one of the cache latches included in the first cache latch group is defective.

8. The memory device of claim 3, wherein the cache latches included in each stage in the column direction include at least one of the cache latches coupled to the $2^N$ input/output pins, respectively.

9. The memory device of claim 8, further comprising:
    a first local input/output line set including $2^N$ local input/output lines coupled to first even cache latches including at least one of the even cache latches included in a first stage arrangement in the column direction and first odd cache latches including at least one of the odd cache latches included in a second stage arrangement in the column direction, wherein the first local input/output line set is arranged above the first even cache latches, above the first odd cache latches, or between the first even cache latches and the first odd cache latches.

10. The memory device of claim 9, further comprising:
a second local input/output line set including $2^N$ local input/output lines coupled to second even cache latches including at least one of even cache latches included in a third stage arrangement in the column direction and second odd cache latches including at least one of odd cache latches included in a fourth stage arrangement in the column direction, wherein the second local input/output line set is arranged above the second even cache latches, above the second odd cache latches, or between the second even cache latches and the second odd cache latches.

11. The memory device of claim 10, further comprising:
a third local input/output line set including $2^N$ local input/output lines coupled to third even cache latches including at least another even cache latch included in the first stage arrangement in the column direction and third odd cache latches including at least another odd cache latch included in the second stage arrangement in the column direction; and a fourth local input/output line set including $2^N$ local input/output lines coupled to fourth even cache latches including at least another even cache latch included in the third stage arrangement in the column direction and fourth odd cache latches including at least another odd cache latch included in the fourth stage arrangement in the column direction.

12. The memory device of claim 11, further comprising:
a first switching unit coupled between the first local input/output line set and a first global input/output line set;

a third switching unit coupled between the third local input/output line set and the first global input/output line set;

a second switching unit coupled between the second local input/output line set and a second global input/output line set; and a fourth switching unit coupled between the fourth local input/output line set and the second global input/output line set.

13. The memory device of claim 12, wherein the first switching unit is arranged between the even cache latches included in the first stage arrangement in the column direction and the odd cache latches included in the second stage arrangement in the column direction.

14. The memory device of claim 13, wherein each of the first to fourth switching units is sequentially selected when data stored in the plurality of cache latches are output, a selected switching unit electrically connects a local input/output line set corresponding to the selected switching unit and a global input/output line set corresponding to the selected switching unit to each other, and an unselected switching unit electrically disconnects a local input/output line set corresponding to the unselected switching unit from a global input/output line set corresponding to the unselected switching unit.

15. The memory device of claim 1, wherein the memory cell array includes a main data area storing user data and a spare area storing spare data, and the plurality of cache latches include main cache latches coupled to the main data area and spare cache latches coupled to the spare area through the bit lines.

16. The memory device of claim 15, wherein a first main latch group including a plurality of main cache latches adjacent to each other, among the main cache latches, has a two-dimensional arrangement not in a rectangular shape, a first spare cache latch group including a plurality of spare cache latches adjacent to each other, among the spare cache latches, has a two-dimensional arrangement not in a rectangular shape, the first main cache latch group and the first spare cache latch group are arranged adjacent to each other, and a unit cache latch block including the first main cache latch group and the first spare cache latch group has a two-dimensional arrangement in a rectangular shape.

* * * * *